United States Patent
Huang et al.

(10) Patent No.: US 9,552,978 B1
(45) Date of Patent: Jan. 24, 2017

(54) METHOD OF DECREASING FIN BENDING

(71) Applicant: UNITED MICROELECTRONICS CORP., Hsin-Chu (TW)

(72) Inventors: Tong-Jyun Huang, Tainan (TW); Li-Wei Feng, Kaohsiung (TW); Shih-Hung Tsai, Tainan (TW); Jyh-Shyang Jenq, Pingtung County (TW); Chien-Ting Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/059,282

(22) Filed: Mar. 2, 2016

(51) Int. Cl.
| | | |
|---|---|---|
| *H01L 21/762* | (2006.01) | |
| *H01L 21/02* | (2006.01) | |
| *H01L 21/3105* | (2006.01) | |
| *H01L 29/66* | (2006.01) | |

(52) U.S. Cl.
CPC ..... *H01L 21/02164* (2013.01); *H01L 21/0223* (2013.01); *H01L 21/02277* (2013.01); *H01L 21/31056* (2013.01); *H01L 29/66795* (2013.01)

(58) Field of Classification Search
CPC ........... H01L 21/76224; H01L 27/0886; H01L 29/785
USPC .......................................... 257/368; 438/427
See application file for complete search history.

(56) References Cited

U.S. PATENT DOCUMENTS

| | | | |
|---|---|---|---|
| 2009/0061647 A1 | 3/2009 | Mallick | |
| 2014/0231919 A1* | 8/2014 | Peng | H01L 21/76224 257/368 |
| 2014/0273412 A1* | 9/2014 | Wu | H01L 21/0206 438/478 |
| 2014/0302690 A1 | 10/2014 | Underwood | |

* cited by examiner

*Primary Examiner* — Julio J Maldonado
*Assistant Examiner* — Hajar Kolahdouzan
(74) *Attorney, Agent, or Firm* — Winston Hsu; Scott Margo

(57) ABSTRACT

A method of decreasing fin bending, includes providing a substrate including a plurality of fins, wherein a plurality of trenches are defined by the fins, the trenches include a first trench and a second trench, and the second trench is wider than the first trench. Later, a flowable chemical vapor deposition process is performed to form a silicon oxide layer covering the fins, filling up the first trench and partially filling in the second trench. After that, the silicon oxide layer is solidified by a UV curing process. Finally, after the UV curing process, the silicon oxide layer is densified by a steam anneal process.

7 Claims, 4 Drawing Sheets

METHOD OF DECREASING FIN BENDING

BACKGROUND OF THE INVENTION

1. Field of the Invention

The present invention relates to a method of decreasing fin bending, and more particular relates to a method to decreasing fin bending by a UV curing process and a steam anneal process.

2. Description of the Prior Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

To achieve these goals, fin FETs (FinFETs) or multiple gate transistors are used. FinFETs not only improve areal density, but also improve gate control of the channel.

Shallow trench isolation (STI) is formed to define the fins. However, there is unexpected force retained in the shallow trench isolation. This causes significant stresses applied on the fins, and hence the fins may have bending and cracking.

SUMMARY OF THE INVENTION

A method of decreasing fin bending includes providing a substrate comprising a plurality of fins, wherein a plurality of trenches are defined by the fins, the trenches comprise a first trench and a second trench, and the second trench is wider than the first trench. Later, a flowable chemical vapor deposition process is performed to form a silicon oxide layer covering the fins, filling up the first trench and partially filling in the second trench. After that, the silicon oxide layer is solidified by a UV curing process. Finally, after the UV curing process, the silicon oxide layer is densified by a steam anneal process.

The present invention utilizes the UV curing process followed by the steam anneal process to balance the shrinking forced or the expanding force in the silicon oxide layer; therefore, the fin bending problem can be eliminated.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a method of decreasing fin bending according to a preferred embodiment of the present invention, Wherein:

FIG. 1 depicts a step of patterning a hard mask.

FIG. 2 depicts a step of forming fins.

FIG. 3 depicts a step of forming a silicon oxide layer and performing a UV curing process.

FIG. 4 depicts a step of performing a steam anneal process.

FIG. 5 depicts a step of forming a high density plasma oxide layer.

FIG. 6 depicts a step of performing a chemical mechanical polish process.

FIG. 7 depicts a step of performing an etching back process.

DETAILED DESCRIPTION

Figure 1:
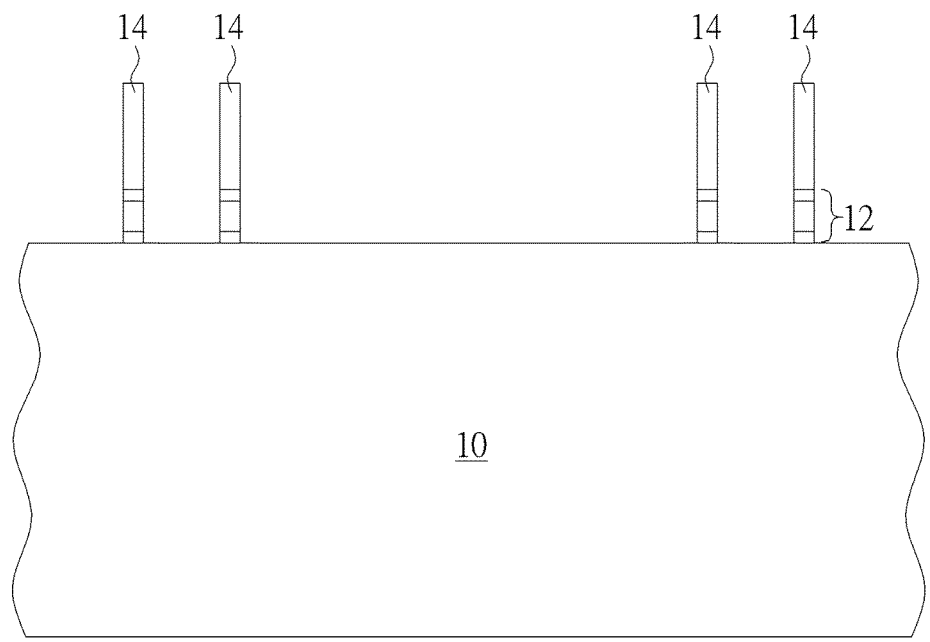
Figure 2:
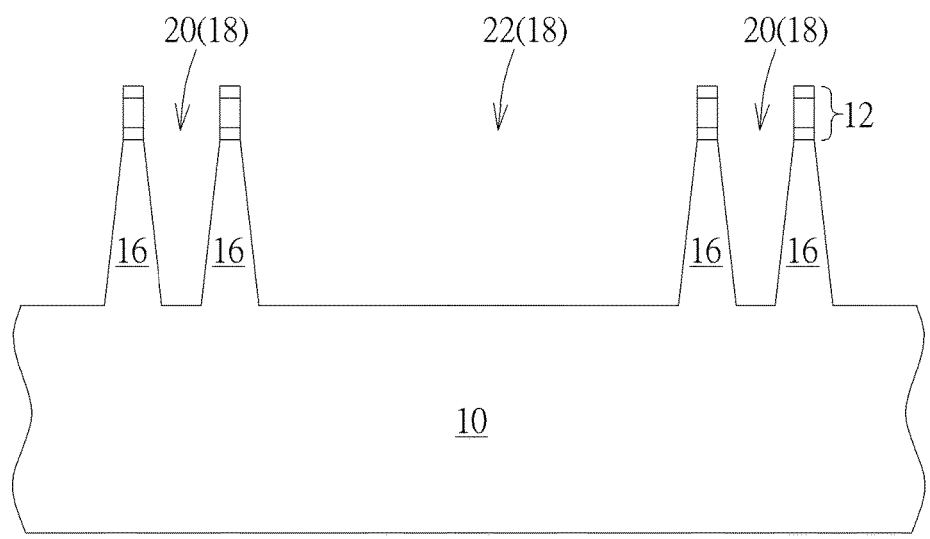

FIG. 1 to FIG. 7 depict a method of decreasing fin bending according to a preferred embodiment of the present invention. As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate is covered by a hard mask 12. The hard mask 12 can be a single layer or multiple layers. The hard mask 12 may be formed by silicon oxide, silicon nitride, silicon oxynitride or other suitable materials. Then, a sidewall image transfer (SIT) or an original photolithographic process may be applied to pattern the hard mask 12. For example, a patterned photoresist 14 is formed to cover the hard mask. Later, the hard mask 12 is patterned by taking the patterned photoresist 14 as a mask, and the substrate 10 is exposed through the patterned hard mask 12. As shown in FIG. 2, the patterned photoresist 14 is removed. Later, the exposed substrate 10 is then etched to form several fins 16. Numerous trenches 18 are defined by the fins 16. The trenches 18 include at least one first trench 20 and at least second trench 22. The second trench 22 is wider than the first trench 20. In this embodiment, the number of the first trench 20 is four and the numbers of the second trench 22 is one. Later, a liner (not shown) can be formed on the sidewall and the bottom of the first trench 20 and the second trench 22.

Figure 3:
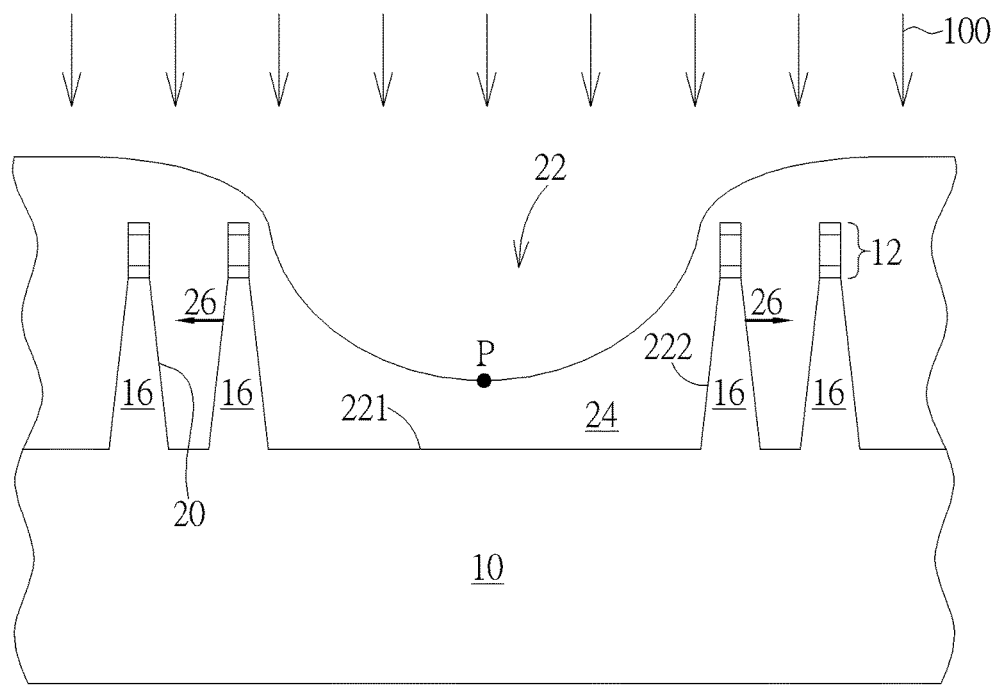

As shown in FIG. 3, a flowable chemical vapor deposition process is performed to form a silicon oxide layer 24 covering the fins 16, filling up the first trench 20 and partially filling in the second trench 22. The silicon oxide layer 24 is preferably 1000 angstroms. In detail, each of the first trenches 20 is filled up by the silicon oxide layer 24, and a top surface of the silicon oxide layer 24 in the first trench 20 is higher that a top surface of the hard mask 12. A top surface of the silicon oxide layer 24 in the second trench 22 has a concave profile, and the lowest point P of the concave profile is lower than the top surface of the hard mask 12. Furthermore, a bottom 221 and two sidewalls 222 of the second trench 22 are entirely covered by the silicon oxide layer 24. After that, the silicon oxide layer 24 is solidified by a UV curing process. During the UV curing process, the UV light breaks the chemical bonds of the silicon oxide layer 24 so as to form a shrinking force within the silicon oxide layer 24 within the first trenches 20, and within the second trench 22. Since the second trench 22 is only partially filled, the shrinking force provided by the silicon oxide layer 24 in the second trench 22 is significantly less than the shrinking force provided by the silicon oxide layer 24 in the first trenches 20. Therefore, direction of the shrinking force of the entire silicon oxide layer 24 is dominated by the silicon oxide layer 24 in the first trenches 20. As a result, the dominating shrinking force 26 points away from the second trench 22. In other words, the dominating shrinking force 26 points from the silicon oxide layer 24 having the top surface lower than that of the hard mask 12 to the silicon oxide layer 24 having the top surface higher than that of the hard mask 12.

Figure 4:
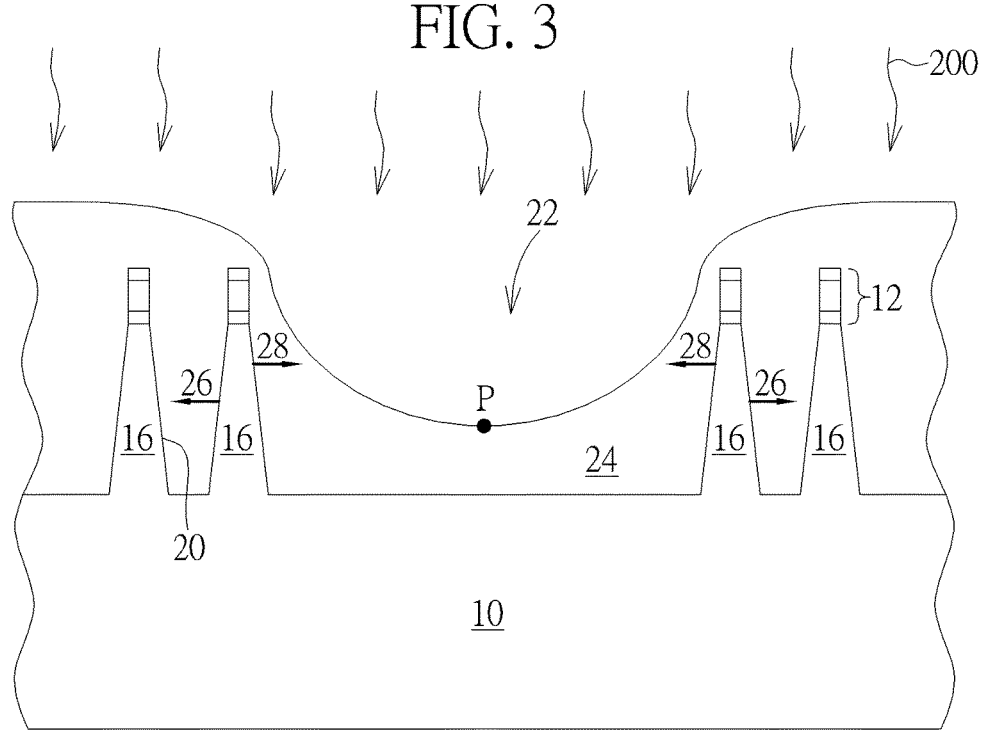

As shown in FIG. 4, after the UV curing process 100, the silicon oxide layer 24 is densified by a steam anneal process 200. The steam anneal process 200 includes oxidizing the silicon oxide layer 24 in hydrogen/oxygen ambient. During the steam anneal process 200, the oxygen atom invades into the silicon oxide layer 24 therefore the volume of the silicon oxide layer 24 is expanded. As a result, an expanding force is formed within the silicon oxide layer 24 within the first trenches 20 and within the second trench 22. Since the second trench 22 is partially filled, the expanding force provided by the silicon oxide layer 24 in the second trench 22 is significantly less than the expanding force provided by the silicon oxide layer 24 in the first trenches 20. Therefore, direction of the expanding force of the entire silicon oxide layer 24 is dominated by the silicon oxide layer 24 in the first trenches 20. As a result, the dominating expanding force 28 points toward the second trench 22. In other words, the dominating expanding force 28 points from the silicon oxide layer 24 having the top surface higher than that of the hard mask 12 to the silicon oxide layer 24 having the top surface lower than that of the hard mask 12. The dominating shrinking force 26 and dominating expanding force 28 are parallel, and in opposite directions.

Because the directions of the dominating shrinking force 26 and the dominating expanding force 28 may be of equal magnitude and in opposite directions, they balance each other, and a net force of the dominating shrinking force 26 and the dominating expanding force 28 is zero. In another case, the dominating shrinking force 26 is slightly greater than the dominating expanding force 28, and the net force of the dominating shrinking force 26 and the dominating expanding force 28 points away from the second trench 22 but in smaller magnitude than the dominating shrinking force 26. In this way, fin bending caused by the force in the silicon oxide layer 24 can be decreased, and even be eliminated.

Figure 5:
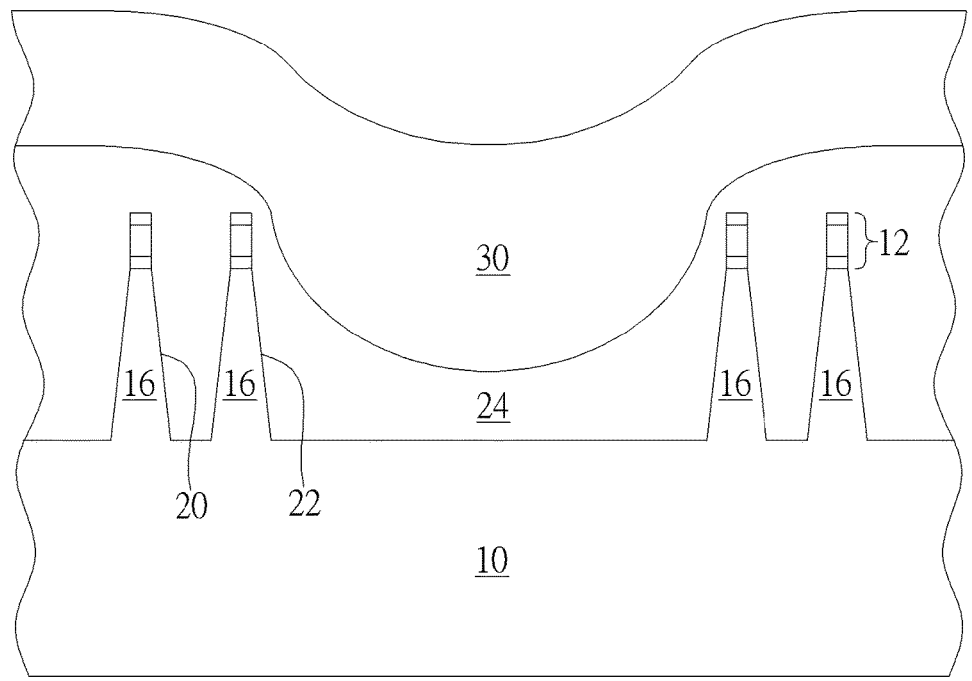
Figure 6:
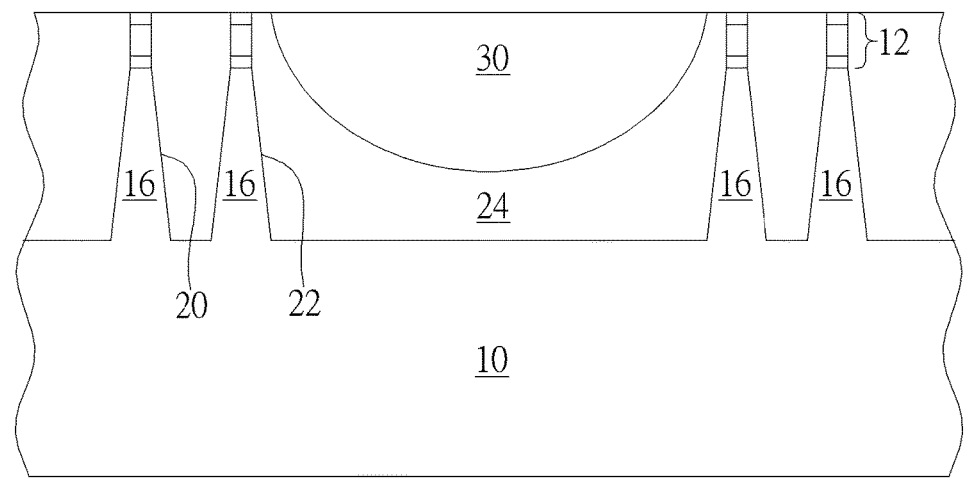

As shown in FIG. 5, a high density plasma oxide layer 30 is formed to conformally cover the entire silicon oxide layer 24 and fills in the second trench 22. The high density plasma oxide layer 30 is formed by using a high density plasma chemical vapor deposition process. The thickness of the high density plasma oxide layer 30 is preferably 2500 angstroms. As shown in FIG. 6, a chemical mechanical polish process is performed to remove part of the high density plasma oxide layer 30 by taking the hard mask 12 as a stop layer so as to align a top surface of the high density plasma oxide layer 30 with a top surface of the silicon oxide layer 24. In detail, the high density plasma oxide layer 30 and the silicon oxide layer 24 above a top surface of the hard mask 12 are removed.

Figure 7:
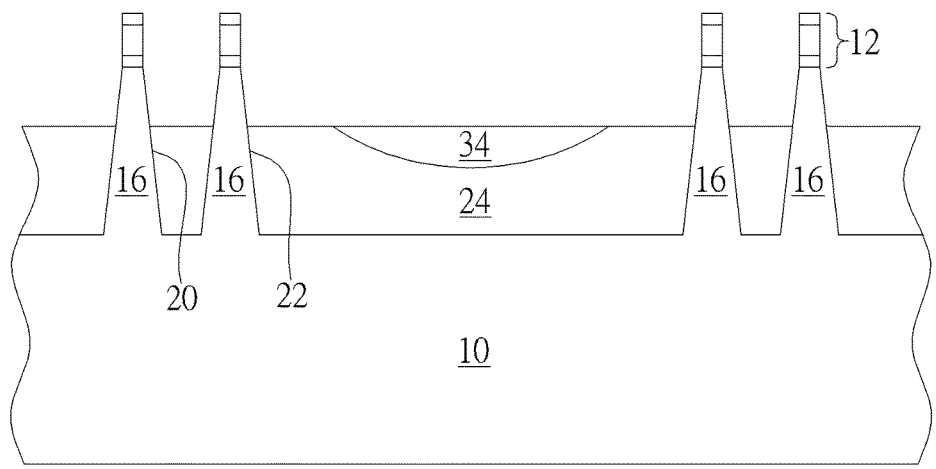

As shown in FIG. 7, an etching back process is performed to simultaneously etch the silicon oxide layer 24 and the high density plasma oxide layer 30 to make the top surface of the silicon oxide layer 24 lower than uppermost surfaces of all fins 16. During the etching back process, the hard mask 12 protects the fins 16. After the etching back process, the hard mask 12 can be removed optionally. Because the rigidity of the high density plasma oxide layer 30 is larger than the rigidity of the silicon oxide layer 24 formed by the flowable chemical vapor deposition process, the dishing problem will not happen after the etching back process. On the contrary, if the high density plasma oxide layer 30 is replaced by another silicon oxide layer formed by a flowable chemical vapor deposition process, the dishing problem will occur on that another silicon oxide layer after the etching back process. Therefore, it is important to use the high density plasma oxide layer 30 rather than the silicon oxide layer formed by the flowable chemical vapor deposition process to cover the silicon oxide layer 24.

Furthermore, it is noteworthy that there is not any anneal process between the etching back process and the chemical mechanical polish process in the present invention. Generally, the anneal process between the etching back process and the chemical mechanical polish process is for compensating the shrinking force applied to the fins 16 by the silicon oxide layer 24. However, the method of the present invention balances the dominating shrinking force 26 of the silicon oxide layer 24 by the steam anneal process performed before the high density plasma oxide layer 30 is formed. In other words, according the present invention, the fin bending problem is solved before the step of forming the high density plasma oxide layer 30. Therefore, an anneal process between the etching back process and the chemical mechanical polish process can be omitted, and the fabricating steps can be reduced. Furthermore, the method of decreasing fin bending of the present invention only needs two primary steps including the UV curing process 100 and the steam anneal process 200, and the step of forming the high density plasma oxide layer is not critical for reducing fin bending, and can be omitted. Therefore, using the UV curing process 100 and the steam anneal process 200, the solution of the fin bending problem is simplified.

Moreover, the UV curing process in the present invention is critical, and cannot be replaced by a conventional $O_3$ curing. Because the conventional $O_3$ curing makes the volume of the silicon oxide layer expand, a dominating expanding force will be formed in the silicon oxide layer. In the end, the dominating expanding force formed by the conventional $O_3$ curing cannot be balanced by the steam anneal process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of decreasing fin bending, comprising:
   providing a substrate comprising a plurality of fins, wherein a plurality of trenches are defined by the fins, the trenches comprise a first trench and a second trench, and the second trench is wider than the first trench;
   performing a flowable chemical vapor deposition process to form a silicon oxide layer covering the fins, filling up the first trench and partially filling in the second trench;
   solidifying the silicon oxide layer by a UV curing process;
   after the UV curing process, densifying the silicon oxide layer by a steam anneal process; and
   after the steam anneal process, forming a high density plasma oxide layer covering the silicon oxide layer and filling in the second trench.

2. The method of decreasing fin bending of claim 1, further comprising:
   performing a chemical mechanical polish process to remove part of the high density plasma oxide layer so as to align a top surface of the high density plasma oxide layer with a top surface of the silicon oxide layer.

3. The method of decreasing fin bending of claim 2, further comprising:
   after the chemical mechanical polish process, performing an etching back process to etch the silicon oxide layer and the high density plasma oxide layer to make the top surface of the silicon oxide layer lower than an uppermost surface of each of the fins.

4. The method of decreasing fin bending of claim 3, wherein there is not any anneal process performed between the etching back process and the chemical mechanical polish process.

5. The method of decreasing fin bending of claim 1, wherein a shrinking force is formed within the silicon oxide layer in the first trench by performing the UV curing process on the silicon oxide layer, and the shrinking force points away from the second trench.

6. The method of decreasing fin bending of claim 1, wherein an expanding force is formed within the silicon oxide layer in the first trench by performing the steam anneal process on the silicon oxide layer, and the expanding force points toward the second trench.

7. The method of decreasing fin bending of claim 1, wherein the steam anneal process comprises oxidizing the silicon oxide layer in hydrogen/oxygen ambient.

\* \* \* \* \*